United States Patent
Aebi

(10) Patent No.: US 8,421,012 B2
(45) Date of Patent: Apr. 16, 2013

(54) LOW ENERGY PORTABLE LOW-LIGHT CAMERA WITH WAVELENGTH CUTOFF

(75) Inventor: Verle W. Aebi, Menlo Park, CA (US)

(73) Assignee: Intevac, Inc., Santa Clara, CA (US)

( * ) Notice: Subject to any disclaimer, the term of this patent is extended or adjusted under 35 U.S.C. 154(b) by 190 days.

(21) Appl. No.: 12/873,225

(22) Filed: Aug. 31, 2010

(65) Prior Publication Data
US 2011/0049365 A1 Mar. 3, 2011

Related U.S. Application Data

(60) Provisional application No. 61/238,641, filed on Aug. 31, 2009.

(51) Int. Cl.
*H01L 31/00* (2006.01)
(52) U.S. Cl.
USPC .......................................................... 250/332
(58) Field of Classification Search .................. 250/330, 250/332
See application file for complete search history.

(56) References Cited

U.S. PATENT DOCUMENTS

| | | | |
|---|---|---|---|
| 4,687,922 A | 8/1987 | Lemonier et al. | |
| 5,047,821 A | 9/1991 | Costello et al. | |
| 5,576,559 A | 11/1996 | Davis | |
| 6,121,612 A | 9/2000 | Sinor et al. | |
| 6,229,152 B1 | 5/2001 | Dries et al. | |
| 6,285,018 B1 | 9/2001 | Aebi et al. | |
| 6,573,581 B1 | 6/2003 | Sugg et al. | |
| 6,597,112 B1 | 7/2003 | Sillmon | |
| 6,657,178 B2 | 12/2003 | Aebi | |
| 6,740,861 B2 | 5/2004 | Matsuda | |
| 6,852,976 B2 | 2/2005 | Barton et al. | |
| 7,453,129 B2 | 11/2008 | King et al. | |
| 7,608,825 B2 | 10/2009 | Nagai et al. | |
| 7,651,880 B2 | 1/2010 | Tweet et al. | |
| 2002/0135035 A1 | 9/2002 | Yamaguchi et al. | |
| 2006/0267054 A1 | 11/2006 | Martin et al. | |
| 2008/0142714 A1 | 6/2008 | Nagai et al. | |
| 2008/0308891 A1 | 12/2008 | Boisvert et al. | |

OTHER PUBLICATIONS

International Search Report for PCT/US10/047406 dated Oct. 29, 2010.
Mishri L. Vatsia, et al., "Night-Sky Radiant Sterance from 450 to 2000 Nanometers," Army Electronics Command, Fort Belvoir, Virginia, Sep. 1972.
Bora M. Onat, et al., "Ultra Low Dark Current InGaAs Technology for Focal Plane Arrays for Low-Light Level Visible-Shortwave Infrared Imaging," Proceedings of SPIE, vol. 6542, 2007.
Verle Aebi, et al., "Laser-Illuminated Viewing Provides Long-Range Detail," Laser Focus World, p. 147-150, Sep. 2000.

*Primary Examiner* — Mark R Gaworecki
(74) *Attorney, Agent, or Firm* — Nixon Peabody LLP; Joseph Bach, Esq.

(57) ABSTRACT

A sensor for night vision applications is provided, wherein the sensor comprises a semiconductor absorption layer of composition that limits long wavelength response cutoff to between 1.25 to 1.4 μm wavelength. The selection of this cutoff frequency provides improved dark current performance, thereby requiring less cooling of the sensor. Consequently, energy consumption is reduced, as the sensor does not require active cooling, so that the sensor is particularly beneficial for mobile night vision applications where battery weight is of high importance.

20 Claims, 5 Drawing Sheets

LOW ENERGY PORTABLE LOW-LIGHT CAMERA WITH WAVELENGTH CUTOFF

RELATED APPLICATIONS

This Application claims priority benefit from U.S. Provisional Application Ser. No. 61/238,641, filed Aug. 31, 2009, the entire disclosure of which is incorporated herein by reference.

BACKGROUND

1. Field of Invention

This invention relates to the field of Low Light Level Imaging for Night Vision Applications.

2. Related Art

Photocathode based image intensifier tubes, Electron Bombarded CCDs (EBCCD), and Electron Bombarded Active Pixel Sensors (EBAPS) are well known for the purpose of acquiring images under low light level illumination conditions. EBAPS are described in U.S. Pat. No. 6,285,018 B1. EBCCDs are described in U.S. Pat. No. 4,687,922. These photocathode based devices employ a wide array of photocathode materials ranging from traditional multi-alkali and bi-alkali photocathodes used in so called Generation-II image intensifiers to modern negative electron affinity (NEA) III-V semiconductor photocathodes using GaAs, $GaAs_{1-x}P_x$ (lattice constant and bandgap determined by value of x, $0 \leq x \leq 1$), and related III-V semiconductor materials. Image intensifiers employing GaAs photocathodes are used in Generation III image intensifiers that are widely used in Night Vision Goggles as described in U.S. Pat. No. 6,597,112. An InGaAs NEA photocathode for use in image intensifiers is described in U.S. Pat. No. 6,121,612. EBAPS cameras using GaAs photocathodes are widely used for low light level imaging cameras and digital night vision systems.

More recently Transferred Electron (TE) photocathodes using an InGaAs light absorbing layer lattice matched to InP (InGaAs composition is $In_{0.53}Ga_{0.47}As$ for InP lattice matched InGaAs) and an InP emission layer have been employed in EBAPS for active systems utilizing laser illumination at 1.06 microns or in the 1.5 to 1.6 micron wavelength range. TE photocathodes are described in U.S. Pat. Nos. 5,047,821 and 5,576,559. In these systems the laser is pulsed and the photocathode-to-anode high voltage is pulsed in a timing relationship with the laser to enable imaging of illuminated objects at a predetermined range from the system employing the laser and EBAPS camera.

Solid State focal plane arrays are also employed in low light level imaging systems targeted for Night Vision applications. Exemplary Solid State (semiconductor) imaging sensors include silicon CMOS imaging arrays, silicon charge coupled devices (CCD), hybridized photodiode or avalanche photodiode arrays where the light sensing photodiodes are bonded to a Read Out Integrated Circuit (ROIC), and germanium photodetectors integrated with a silicon readout circuit. In this disclosure the term photodiode will be defined to include photodiode, avalanche photodiode, and photodetectors directly integrated with the ROIC.

The hybridized photodiode array enables use of semiconductors other than silicon for the light sensing element. Semiconductors used for the hybridized photodiode array include $Hg_{1-x}Cd_xTe$ of varying compositions determined by value of x between 0 and 1, InSb, and InGaAs among other materials known in the art. These semiconductor materials have sensitivity in other spectral regions than silicon. Typically these materials have a long wavelength cutoff in the SWIR or Infra-Red portion of the electromagnetic spectrum with long wavelength cutoffs ranging from 1.7 μm to 12 μm. The long wavelength cutoff is determined by the energy bandgap of the material. The energy bandgap is a function of the material composition for the ternary and quaternary semiconductor alloys. These semiconductor materials may have short wave cutoffs extending into the visible (0.4-0.7 micron wavelength) or Near Infra-Red (0.7-1 micron wavelength) portions of the spectrum. InGaAs photodiode array image sensors are described in U.S. Pat. Nos. 6,852,976 B2 and 6,573,581 B1.

Monolithic image sensors utilizing photosensitive elements comprised of germanium that is directly integrated with the silicon readout circuit are disclosed in U.S. Pat. Nos. 7,453,129 and 7,651,880 B2. These image sensors employ germanium as the optical absorbing material and have a long wavelength cutoff of 1.6 μm.

Night Vision sensors are constrained to use the available light at night. FIG. 1 shows the relative nighttime photon flux versus wavelength on moonlit and moonless nights as measured by Vatsia over the 0.47 to 1.93 micron spectral range. The variation in available light at particular wavelength bands is due to atmospheric absorption over specific regions due to water and other atmospheric gases and due to the emission spectrum of optical sources at night including moonlight, starlight, and emission from the upper atmosphere. At wavelengths greater than 2 microns thermal radiation due to blackbody emission of objects at ambient temperature becomes significant relative to other sources of available light at night and one moves into the realm of thermal imaging. The object of this invention is to provide improved night time imaging performance using reflected ambient light, not thermal imaging using blackbody radiation.

Examination of FIG. 1 shows that substantially more light is available on moonless nights at longer wavelengths. The low amount of light available on moonless nights provides the greatest challenge to Night Vision image sensors. Night Vision device performance is limited by the amount of available light on moonless nights. Due to the increased photon flux at wavelengths above 1.5 μm, designers of night vision image sensors have focused on developing sensors that extend sensitivity to these higher wavelengths, i.e., to include detection of photons in the 1.4-1.9 μm range. An example of this is disclosed in U.S. Pat. No. 7,608,825 B2 where the long wavelength cutoff of the semiconductor optical absorber layer is extended from 1.7 μm for $In_{0.53}Ga_{0.47}As$ to wavelengths as long at 3.0 μm by epitaxial growth of GaInNAsP, GaInNAsSb or GaInNAs semiconductor layers of varying composition of the Group III and Group V constituents of the quaternary or quinary semiconductor lattice matched to an InP substrate.

High performance sensors have other requirements for good night vision performance in addition to spectral response range. Two fundamental requirements are high quantum efficiency (photon detection efficiency) over the sensitive wavelength range with low associated dark noise. Dark noise is dominated by thermally generated dark current in a high performance sensor. Dark current magnitude is a critical performance parameter as fundamentally the dark noise associated with the dark current needs to be less than the photogenerated current to obtain imaging performance at a given light level. The combination of these requirements on the photosensing element limits the choice of semiconductor materials for the photocathode or photodiode and specifies image sensor operating temperature.

InGaAs lattice matched to an InP substrate has been used in the past to meet these requirements for the photosensing material. The InGaAs composition that results in the same lattice constant as InP is $In_{0.53}Ga_{0.47}As$ this composition of InGaAs is also denoted by the term "lattice matched InGaAs or InGaAs lattice matched to InP" in this disclosure. InGaAs lattice matched to InP is sensitive to 1.7 micron and shorter wavelength light. The short wavelength cutoff ranges from 0.4 to 0.95 micron depending upon the specific structure of the photocathode or photodiode. This wavelength range captures substantially more light than the commonly used GaAs, Generation-III, photocathode that is sensitive over the 0.4-0.9 micron Visible Near Infra-Red (VNIR) wavelength band. Use of InGaAs lattice matched to InP minimizes material defects in the epitaxially grown InGaAs layer. This minimizes dark current typically generated by defects in the epitaxial layer.

There is considerable interest in extending the spectral response of manportable night vision systems into the Short Wave Infra-Red (SWIR) spectral band (0.95-1.7 µm for an $In_{0.53}Ga_{0.47}As$ photodiode focal plane array or photocathode with an integral InP substrate). For these applications performance, size, weight, and power are all critical requirements. Today hybridized photodiode/ROIC focal plane arrays (FPA) consisting of an array of $In_{0.53}Ga_{0.47}As$ photodiodes bump bonded to an ROIC are the state-of-the-art. However these FPAs have performance, size, and power constraints that limit their applicability to manportable night vision systems.

System size, weight, unit cost, and power consumption are critical night vision system metrics. Size and performance are impacted by the relatively large pixel size (15 µm for state-of-the-art, developmental, FPAs and 25 µm for commercially available product) of the available SWIR FPAs. The minimum pixel size is limited by the bump bonding technology used to attach the photodiode array to the ROIC. This restricts overall sensor format to SXGA (1280×1024) and lower array sizes to maintain an acceptable overall FPA size. Larger FPAs would increase system size and cost to unacceptable levels for manportable applications.

The smaller array size limits system resolution and object detection range for the desired large field of view systems used for manportable night vision. A typical image intensifier tube based night vision goggle has a 40° Field of View and the equivalent resolution of a modern image intensifier is approximately 6 to 9 megapixels. One object of this invention is to increase the array size of a SWIR image sensor relative to the prior art for use as a night vision image sensor.

Power is impacted from the requirement for some level of cooling for nighttime SWIR imaging applications other than laser spot detection. Cooling is required as the level of dark current emitted by either an $In_{1-x}Ga_xAs$ or other semiconductor used for imaging in the SWIR band or at longer wavelengths is too high at room temperature (20°-25° C.) to enable low light level imaging on moonless nights. The provision of cooling for portable applications places a high demand on batteries, thereby reducing the useful operational time of the device before batteries are emptied.

A SWIR EBCCD can be achieved by replacing the GaAs photocathode with an $In_{0.53}Ga_{0.47}As$ based photocathode. This has been demonstrated by Intevac for Laser Illuminated Viewing and Ranging (LIVAR®) applications (V. Aebi and P. Vallianos, "Laser-illuminated viewing provides long-range detail," LASER FOCUS WORLD, September 2000). These applications utilize a pulsed eyesafe laser illuminator typically operating at 1.57 µm. The present LIVAR camera utilizes an InGaAs photocathode used in an EBAPS with a CMOS anode array.

In LIVAR applications the photocathode is gated on for very short periods (typically in the 100 ns to 2 µs time range). This low duty cycle enables operation at ambient temperature (<40 degrees C.) without performance being photocathode dark current limited. InGaAs lattice matched to InP and used in a TE photocathode configuration is a good choice for this application with 20 degree C. emitted dark current in the 10-40 nA/cm^2 range and good sensitivity in the 1.5-1.6 micron spectral range for compatibility with eyesafe laser illuminators.

Passive night time imaging requires continuous integration of the light by the image sensor to maximize light collection. Under these conditions substantial cooling is required of the $In_{0.53}Ga_{0.47}As$ TE photocathode to reduce dark current to an acceptable level to achieve signal limited performance at night (typically cooling to −40 degrees C. is required). This level of cooling substantially increases system size and power requirements making the approach unsuitable for battery operated night vision applications.

Other focal plane arrays used for night vision applications also require cooling to reduce focal plane dark current to levels where it does not limit performance on moonless nights. This includes InGaAs FPAs where dark current limits performance at operating temperatures above about 10° C. and monolithic Ge photodetector arrays directly integrated with a ROIC that require cooling to the −70° C. range. The smaller bandgap semiconductors such as InSb or various alloys of $Hg_{1-x}Cd_xTe$ also require cooling to temperatures substantially below 20° C. to reduce dark current. These cooling requirements limit application of these SWIR image sensors to battery operated applications due to high power requirements for focal plane cooling.

SUMMARY

The following summary of the invention is included in order to provide a basic understanding of some aspects and features of the invention. This summary is not an extensive overview of the invention and as such it is not intended to particularly identify key or critical elements of the invention or to delineate the scope of the invention. Its sole purpose is to present some concepts of the invention in a simplified form as a prelude to the more detailed description that is presented below.

According to aspects of the invention, a sensor for a night vision camera is provided, wherein the sensor comprises a semiconductor absorption layer of composition that limits long wavelength response cutoff to between 1.25 to 1.4 µm wavelength. As can be appreciated, this choice seems counter-intuitive, as conventionally artisans seeks to have sensors having the highest possible long wavelength response cutoff in order to absorb as much light as possible. Therefore, artisans seeks sensors having absorption layer that absorbs light beyond 1.7 µm, so as to absorb the light available beyond the deep reduction in available light in the 1.4 µm-1.5 µm wavelength range, as shown in FIG. 1. However, the inventor has found that for portable applications, the reduced dark current of a sensor having long wavelength response cutoff to between 1.25 to 1.4 µm, provides advantages that more than compensate for the loss of light detection at wavelengths above 1.4 µm. These advantages will be discussed below.

According to aspects of the invention, the night vision camera includes the inventive sensor; an imaging chip positioned behind and connected to the sensor; electronics collecting signals from the imaging chip; and wherein the camera senses light at low lighting conditions at wavelengths below 1.4 µm with low dark current at ambient operating temperatures. Consequently, energy consumption is reduced, as the sensor does not require active cooling.

According to aspects of the invention, a photocathode, photodiode, or avalanche photodiode array is optimized for use in mobile Night Vision systems for use in the Short Wave Infra-Red (SWIR) 0.9 µm-2.0 µm wavelength band. A novel semiconductor structure for the photocathode or photodiode array is optimized to achieve improved performance at elevated operating temperatures relative to prior art SWIR image sensors. The novel structure is suitable for use in image intensifiers for direct view Night Vision systems, photocathode based cameras, and in semiconductor focal plane based image sensors and cameras based on solid state photodiode or avalanche photodiode arrays.

According to aspects of the invention, photocathode or photodiode dark current and overall camera power consumption are addressed through use of $In_{1-x}Ga_xAs_yP_{1-y}$ lattice matched to InP for the SWIR photocathode or photodiode array. The $In_{1-x}Ga_xAs_yP_{1-y}$ composition is optimized to obtain a lattice constant matched to the InP lattice constant. The InP lattice matching conditions for $In_{1-x}Ga_xAs_yP_{1-y}$ as a function of x and y are given by the following formulas:

($0 \leq y \leq 1$) and the corresponding value for $x = 0.1894y/(0.4184-0.013y)$.

The direct energy bandgap, $E_{g,dir}$ of the InP lattice matched $In_{1-x}Ga_xAs_yP_{1-y}$ as specified by the above formulas is given by $E_{g,dir} = 1.35 - 0.775y + 0.149y^2$. Where $E_{g,dir}$ is in eV and y is the As compositional value as defined in the preceding equations for lattice matching to InP. $E_{g,dir}$ is defined by the above equation at a temperature of 298° K.

The $In_{1-x}Ga_xAs_yP_{1-y}$ composition is chosen to optimize spectral response of the $In_{1-x}Ga_xAs_yP_{1-y}$ to maximize detection of moonless night sky illumination while minimizing dark current generated in the $In_{1-x}Ga_xAs_yP_{1-y}$ absorber layer.

BRIEF DESCRIPTION OF THE DRAWINGS

The accompanying drawings, which are incorporated in and constitute a part of this specification, exemplify the embodiments of the present invention and, together with the description, serve to explain and illustrate principles of the invention. The drawings are intended to illustrate major features of the exemplary embodiments in a diagrammatic manner. The drawings are not intended to depict every feature of actual embodiments nor relative dimensions of the depicted elements, and are not drawn to scale.

DETAILED DESCRIPTION

Figure 1:
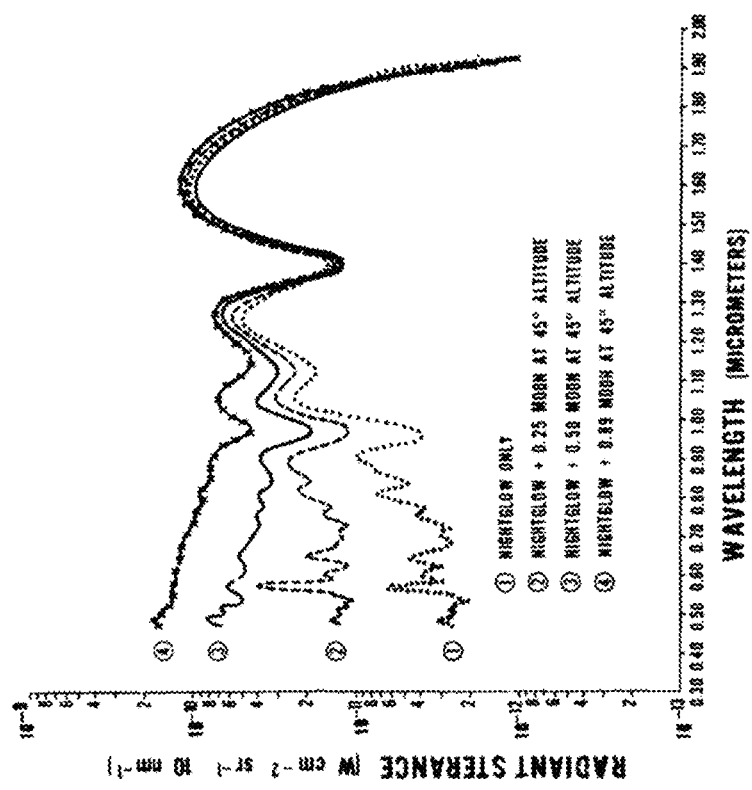
FIG. 1 is a graph with Night Sky illumination data versus wavelength for conditions ranging from full moon illumination to no moon.

FIG. 1 shows the spectral intensity of the night sky illumination as a function of wavelength. This data is disclosed by Vatsia, Mirshri, L. "Atmospheric Optical Environment", Research and Development Technical Report ECOM-7023, September (1972). Curve 1 on this graph plots the illumination level versus wavelength on a moonless night. This represents the darkest, most challenging, condition for operation of a night vision device. It can be observed that there is a large reduction in the available light at night in the 1.4 to 1.5 µm wavelength range. This reduction is caused by absorption of optical radiation in this band by water in the atmosphere. On the other hand, there is a second "maxima" beyond 1.4 µm, centered at about 1.63 µm. Therefore, artisans in the art have sought to develop sensors that have long wavelength cutoff beyond 1.7 µm, so as to capture this second maxima. Conversely, embodiments of this invention restrict the long wavelength cutoff of the semiconductor absorber layer in the image sensor to 1.4 µm or less. For example, according to one specific embodiment, an absorption layer of $In_{1-x}Ga_xAs_yP_{1-y}$ is designed to have a 1.4 µm cutoff wavelength. According to one embodiment, for lattice matched material the specific composition that results in a 1.4 µm cutoff wavelength is: $In_{0.68}Ga_{0.32}As_{0.69}P_{0.31}$. Those skilled in the art will also understand that other semiconductor systems can be substituted for $In_{1-x}Ga_xAs_yP_{1-y}$ to achieve the same advantages. One example is the $(Al_sGa_{1-s})_{1-t}In_tAs$ semiconductor alloy system where s, and t can vary between 0 and 1. This system also has a range of compositions that are lattice matched to an InP substrate and can be used to limit the long wavelength cutoff of the semiconductor layer to the 1.25 µm to 1.4 µm range as specified here-in and with the same advantage of reduced dark current generation as the $In_{1-x}Ga_xAs_yP_{1-y}$ InP lattice matched system.

Although the spectral coverage of this material is from 950-1400 nm (termed Near SWIR or NSWIR) it has the advantage of a factor of 100 or more reduced dark current relative to a conventional InGaAs photocathode or photodiode array operated at the same temperature, thereby greatly reducing sensor cooling requirements. This spectral band still has a factor of 5 or greater photon flux relative to the GaAs VNIR band and is compatible with commonly available 1.3 µm laser or LED sources for out of band laser pointers, illuminators, and markers. The long wavelength cutoff of the InGaAsP photocathode was chosen in the 1250-1400 nm range ($In_{1-x}Ga_xAs_yP_{1-y}$ compositions in the range of $In_{0.68}Ga_{0.32}As_{0.69}P_{0.31}$ to $In_{0.76}Ga_{0.24}As_{0.51}P_{0.49}$ as defined by the above equations for lattice match to InP) to enable good detection of the peak in illumination intensity on moonless nights centered at approximately 1280 nm (FIG. 1).

According to one embodiment, the camera has a 1600× 1200 format with a 10.8 µm pixel and operates at 60 Hz frame rate.

An aspect of the invention is to greatly extend the state-of-the-art of FPAs operating in the SWIR spectral band. According to an embodiment of the invention, the sensor will extend sensitivity to near single photon level and reduce pixel size to 10.8 µm for an UXGA array (1600×1200 format, 2 megapixel array). The FPA achieves this performance by combining a backside illuminated 2 megapixel Active Pixel Sensor (APS) CMOS image chip in an electron bombarded (EB) mode with an InGaAsP based Transferred Electron (TE) photocathode with >30% QE in the NSWIR spectral band. This TE photocathode based Electron Bombarded Active Pixel Sensor (EBAPS®) allows extreme low light sensitivity (single photon sensitivity) for increased sensitivity over present SWIR cameras (InGaAs focal plane array) combined with higher resolution. The NSWIR EBAPS is compatible with low power, battery operated, cameras due to reduced cooling requirements and use of a low power APS CMOS image chip.

Figure 2:
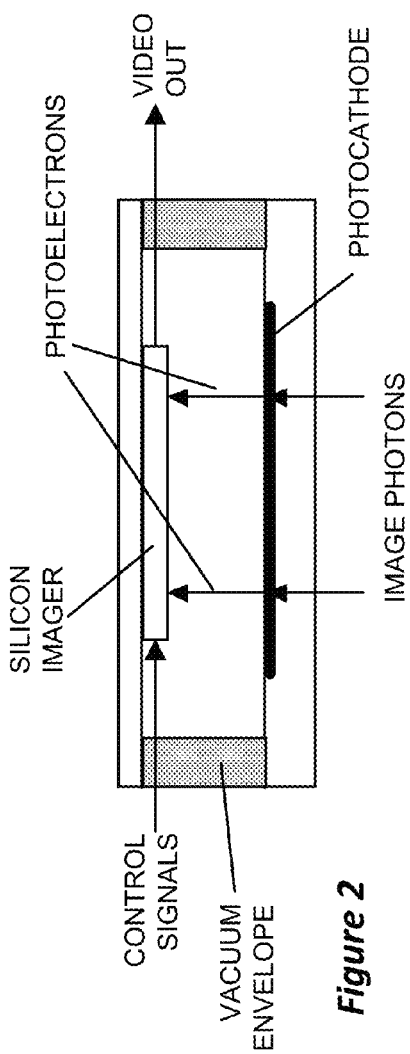
FIG. 2 is a schematic diagram of an EBAPS image sensor.

In EBAPS technology, photoelectrons from a high quantum efficiency photocathode are accelerated by an applied voltage (typically 1 to 3 kV in present proximity focused devices) and imaged directly in a backside illuminated (100% fill factor) silicon CMOS image chip that forms the anode of the sensor (FIG. 2). Low noise gain is achieved by electron multiplication resulting when the high velocity electron beam dissipates its energy in the silicon of the imager chip to produce electron-hole pairs by the electron-bombarded semiconductor gain process. The low read out noise of the CMOS chip when combined with the high electron bombarded gain results in an effective noise floor referenced to the photocathode of well under 1 photoelectron for close to single photon sensitivity.

Figure 3:
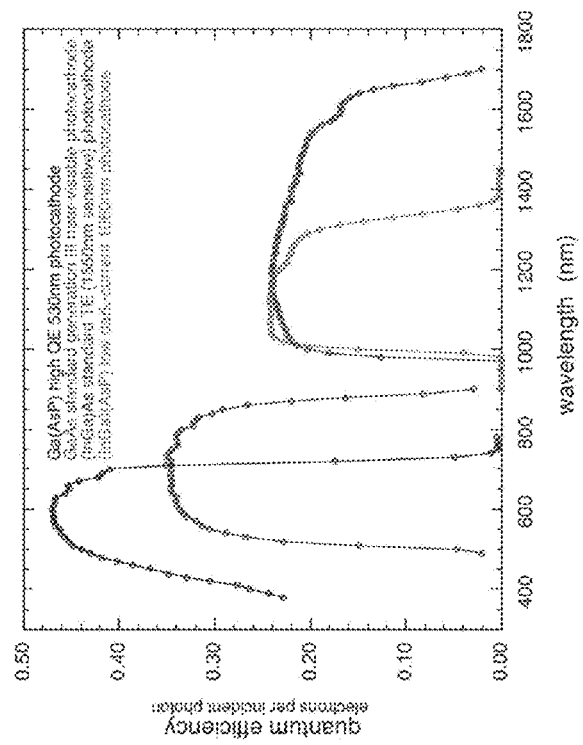
FIG. 3 is a graph with spectral response curves for representative III-V semiconductor photocathodes.

EBAPS technology enables the spectral response of the image sensor to be modified by changing the photocathode. This enables re-use of the CMOS readout array and camera electronics. FIG. 3 illustrates quantum efficiency curves for III-V semiconductor photocathodes fabricated by Intevac.

The performance of staring (passive) SWIR sensors operated at ambient temperature is typically dark current limited at low light levels. In general the sensor becomes dark current limited when the number of photoelectrons collected by the pixel per integration time generated by the input photon flux falls below the square root of the number of dark current electrons generated in the same integration time in the pixel. In practice the image sensor becomes dark current limited at a higher input signal level due to non-uniformity of the dark current generation in the image sensor and with the inclusion of the signal shot noise as part of the noise term in the signal-to-noise of the pixel.

In particular there will exist an optimum semiconductor bandgap in a given material system to achieve maximum Signal-to-Noise Ratio (SNR) for a defined operation temperature for moonless night sky illumination conditions. This results as in general the night sky induced photocurrent will increase with bandgap (wider image sensor spectral bandwidth), but the photocurrent does not increase exponentially with increase in long wavelength cutoff of the image sensor while the dark current does increase exponentially with cutoff wavelength. This is a result of the exponential dependence of dark current generation in a semiconductor versus temperature. For diffusion limited dark current performance the dark current temperature dependence will be proportional to $e^{-Eg/kT}$. For generation-recombination limited dark current performance the dark current temperature dependence will be proportional to $e^{-Eg/2kT}$. In both formulas Eg is the semiconductor bandgap, k is Boltzmann's Constant, and T is temperature in degrees K. In practice most current photon detecting sensors show exponential increase in dark current with temperature that falls between these two bounds.

The $In_{0.53}Ga_{0.47}As$ TE photocathode EBAPS is operated at ambient temperature (>20° C.) for LIVAR and becomes dark current limited when operated as a passive image sensor under night time illumination conditions. This is also the case for present $In_{0.53}Ga_{0.47}As$ photodiode array FPAs.

In addition the present $In_{0.53}Ga_{0.47}As$ TE photocathode EBAPS camera requires several other improvements to allow application of EBAPS based cameras for passive night vision imaging in the SWIR band. The improvements provided by embodiments of the invention may include:
1. The optical format needs to be increased in size for improved low light level performance for wide field of view (40° or greater) night vision applications (⅔" to ⅘" optical format);
2. The array size needs to be increased from VGA to UXGA for improved resolution;
3. Frame rate needs to be increased from 30 Hz to 60 Hz for head mounted mobility applications; and
4. The 20° C. TE photocathode dark current needs to be reduced by two orders of magnitude for passive nighttime imaging applications with minimal cooling requirements.

The first three improvements can be obtained by fabricating an EBAPS anode EBAPS using a CMOS anode array with a larger format. In one embodiment of the invention this array is UXGA format (1600×1200 pixels) with a 10.8 micron pixel pitch resulting in a ⅘" optical format for the image sensor. Response in the SWIR wavelength band can be obtained by using an InGaAs TE photocathode.

Figure 5:
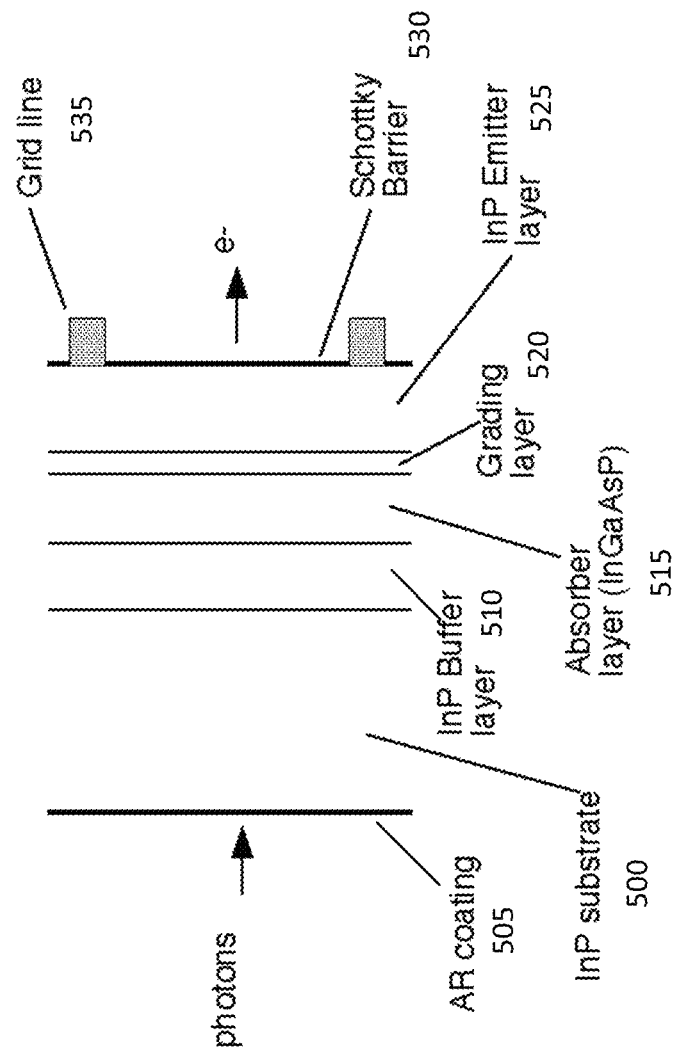
FIG. 5 is a schematic diagram of an $In_{0.71}Ga_{0.29}As_{0.63}P_{0.37}$ Transferred Electron Photocathode structure.

The fourth improvement can be obtained by limiting the long wavelength cutoff of the TE photocathode to approximately 1.35 μm (FIG. 3 InGaAsP photocathode spectral response for InGaAsP with a composition of $In_{0.71}Ga_{0.29}As_{0.63}P_{0.37}$). The disadvantage of this approach is a reduction in the available light on moonless nights relative to the spectral response of the InGaAs photocathode shown in FIG. 3. The Table 1 shows the relative nighttime photon flux versus wavelength band on a moonless night as measured by Vatsia (FIG. 1). The short wavelength cut-off for NSWIR and SWIR detectors is often chosen to be 950 nm. This is a convenient value in that the standard InP substrate is transmissive at wavelengths longer than 950 nm and can serve as a transparent support to the detector as shown in FIG. 5 for a transferred electron photocathode and FIG. 6 for a photodiode. However it should be noted that with additional semiconductor processing this short wavelength cut-off can be shifted to lower wavelengths without violating the teachings of this invention.

TABLE 1

| Spectral Band | Spectral Range | Normalized Photon Flux |
|---|---|---|
| VNIR | 400-900 nm | 1 |
| NSWIR | 950-1350 nm | 5.5 |
| SWIR | 950-1650 nm | 10.5 |

From the data in FIG. 3 and Table 1 it can be seen that the NSWIR $In_{0.71}Ga_{0.29}As_{0.63}P_{0.37}$ sensor according to embodiments of the invention will be sensitive to 52% of the photon flux relative to an $In_{0.53}Ga_{0.47}As$ SWIR based sensor. Consequently, it seems counter-intuitive to use such a sensor for night vision applications. However, as determined by the inventor, this reduced signal level is more than offset by the greatly reduced cooling requirement for the NSWIR photocathode. This is critical for manportable applications in order to conserve batteries. NSWIR based image sensors will have higher SNR performance than $In_{0.53}Ga_{0.47}As$ based SWIR image sensors at operating temperatures in the 10° to 20° C. and higher temperature range due to their lower dark current.

The NSWIR sensor may show further benefits relative to an $In_{0.53}Ga_{0.47}As$ SWIR FPA due to the contrast reversal at about 1400 nm with a green foliage background. Green foliage is highly reflective from approximately 700 nm to 1370 nm with lower reflectivity outside this band. Contrast of many objects or targets of interest relative to a green foliage background may be enhanced by a NSWIR spectral response where the focal plane is only sensitive within this spectral band relative to a sensor with a SWIR spectral response.

The quantum efficiency and dark current performance of a recent InGaAsP NSWIR EBAPS built by the inventor utilizing an $In_{0.71}Ga_{0.29}As_{0.63}P_{0.37}$ photocathode with a 0.95-1.35 micron spectral response is given in Table 2 as compared to dark current for an $In_{0.53}Ga_{0.47}As$ SWIR EBAPS.

TABLE 2

| Parameter | Value | Unit |
|---|---|---|
| Quantum Efficiency @ 1.06 μm | 28.5 | % |
| InGaAsP Dark Current | | |
| @ 20° C. | 90 | pA/cm$^2$ |
| @ 10° C. | 41 | pA/cm$^2$ |
| @ 0° C. | 21 | pA/cm$^2$ |
| InGaAs Dark Current | | |
| @ 20° C. | 40,000 | pA/cm$^2$ |
| @ −40° C. | 47 | pA/cm$^2$ |

From Table 2 it can be seen that the inventive NSWIR $In_{0.71}Ga_{0.29}As_{0.63}P_{0.37}$ photocathode dark current is over 400 times less than that of the InGaAs SWIR photocathode at 20° C.

Night Vision performance has been modeled comparing the NSWIR $In_{0.71}Ga_{0.29}As_{0.63}P_{0.37}$ photocathode with an image sensor utilizing an $In_{0.53}Ga_{0.47}As$ photocathode lattice matched to InP. Performance was compared under the darkest conditions reported by Vatsia in FIG. 1, Night Glow only. The modeling assumed a 30% reflective target across the specified spectral band and use of a T/1.4 lens and a 30 frame per second imaging sensor with an integration time of 1/30 second. SNR was calculated over a 0.2 mm spot size as is the case for image intensifiers used in night vision goggles. This approach takes into account the ability of eye/brain of the observer to integrate low SNR imagery both temporally and spatially. The modeling shows that the additional light over the SWIR band results in approximately a factor of two greater signal. The higher signal is more than offset at a 20 degree C. operating temperature by the much higher dark current of the InGaAs photocathode relative to the InGaAsP photocathode. The InGaAsP photocathode device has a factor of 5 greater SNR than the InGaAs photocathode device.

| Photocathode | Spectral Band | QE | 20° C. Dark Current | Photoelectrons/cm$^2$ | SNR for 0.2 mm spot at 30 Hz Frame Rate |
|---|---|---|---|---|---|
| NSWIR | 950-1350 nm | 30% | 100 pA/cm$^2$ | 13.8 pA/cm$^2$ | 10.5 |
| SWIR | 950-1650 nm | 30% | 10 nA/cm$^2$ | 26.5 pA/cm$^2$ | 2.1 |

Figure 4:
FIG. 4 is a daytime NSWIR image from an InGaAsP photocathode EBAPS Camera operated at 30 Hz frame rate. The high voltage duty cycle was 1 µs.

An uncorrected (Nonuniformity Correction not applied) daytime image captured with the NSWIR EBAPS camera is shown in FIG. 4. This image was captured during the day using a f/1.4, 25 mm focal length, lens optimized for the SWIR band. The high voltage gate time for this image was 1 μs to avoid image saturation. This indicates that the camera has high sensitivity as the integration time can be increased by about 5 orders of magnitude for video rate nighttime imaging. In addition the image gives an example of NSWIR imagery. The high reflectivity of green foliage in the NSWIR band is also evident in the image. This demonstrates the good image contrast obtained in the NSWIR spectral band relative to foliage.

The EBAPS NSWIR camera according to embodiments of the invention will significantly outperform (low light sensitivity and power) present solid-state and photocathode based InGaAs image sensor cameras. Table 4 summarizes the performance for one embodiment of the new camera.

TABLE 4

Performance for NSWIR EBAPS

| | NSWIR EBAPS |
|---|---|
| Focal Plane Format | UXGA (1600 × 1200 pixels) |
| Pixel Size | 10.8 μm |
| Frame Rate | 60 fps |
| Effective Read Noise | <1 electron |
| Spectral Response | 950-1350 nm |
| Quantum Efficiency | >30% |
| Dark Current @ 20° C. | <100 pA/cm$^2$ |

The invention benefits and improvements are the reduced room temperature dark current for low power operation combined with the low effective readout noise enabled by the high electron bombarded gain in the EBAPS. The other features are the small pixel size and the UXGA format. The UXGA format substantially improves resolution at all light levels allowing longer recognition ranges. The small pixel size enables small optics for a given field of view. Small optics are critical to meet size and weight objectives for man-portable equipment.

A structure for an embodiment of a NSWIR TE photocathode is shown in FIG. 5. An InP substrate 500 is coated on its front surface (light receiving surface) with an anti-reflective coating ARC 505. An InP buffer layer is formed on the back side of the substrate 500. Then, an absorption layer 515 is fabricated on the buffer layer. In this specific embodiment, an $In_{0.71}Ga_{0.29}As_{0.63}P_{0.37}$ layer is used as the photon absorbing layer. The composition of this semiconductor (lattice matched to InP) is chosen to select the desired long wavelength cutoff for the photocathode. In this case the bandgap is chosen in the 1.35-1.40 microns wavelength. This minimizes dark current generation as dark current exponentially increases with a reduction in the semiconductor bandgap while maximizing night sky response. A grading layer 520 is fabricated on the absorber, and InP emitted layer 525 is fabricated on the grading layer. Finally, a Schottky barrier 530 caps the back of the sensor and grid lines 535 are provided to allow a bias voltage to be applied to the Schottky barrier.

The InGaAsP bandedge is chosen to fall in the 1.35-1.4 micron range as there is a reduction in night sky illumination in the 1.4-1.5 micron range as shown by Vatsia. Sensitivity in the 1.4 to 1.5 micron range would not significantly increase the number of detected photons under night time illumination conditions.

According to one example, an SXGA format CMOS based EBAPS is fabricated utilizing a NSWIR InGaAsP TE photocathode with a spectral response from 950-1350 nm. A Camera utilizing the NSWIR EBAPS sensor can be fabricated. The camera may be supplied with a Thermo Electric Cooler (TEC) controller to enable up to 20° C. lower operating temperature than ambient and allow performance investigation at below ambient operating temperatures. The camera will utilize a cameralink video interface. The camera can be integrated with standard lens.

Many of the advantages of this invention can also be obtained by replacing the presently used InGaAs semiconductor layer used in PIN photodiode arrays bonded to a read out integrated circuit (ROIC) with an InGaAsP (e.g., $In_{0.71}Ga_{0.29}As_{0.63}P_{0.37}$) layer as used in the TE photocathode structure describe herein. This structure also has the advantage of greatly reduced dark current for a defined operating temperature and the same spectral response as with the NSWIR TE photocathode.

Figure 6:
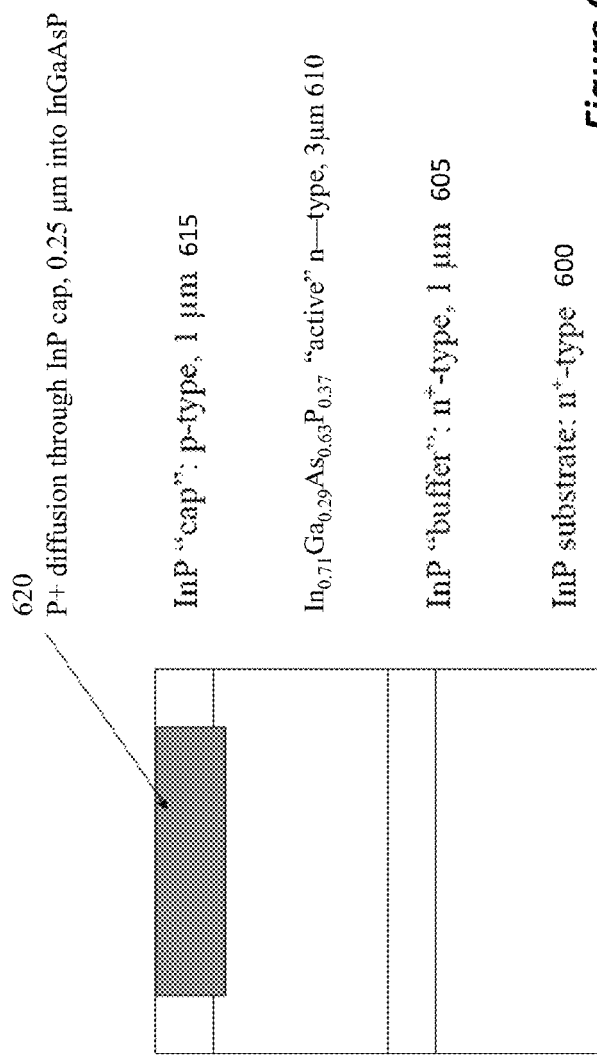
FIG. 6 is a schematic diagram of an $In_{0.71}Ga_{0.29}As_{0.63}P_{0.37}$ PIN photodiode structure.

A PIN photodiode structure according to an embodiment of the invention is shown in FIG. 6. An array of photodiodes with this or similar structures familiar to those skilled in the art can be hybridized with a ROIC to form a NSWIR image sensor according to this invention. An InP buffer layer 605 is fabricated over an InP substrate 600 of n+ type. Then an InGaAsP active layer 610 is fabricated over the buffer layer. The InGaAsP layer is an n⁻-type layer having a 1.4 μm cutoff wavelength. For example, a 3 micron thick layer of $In_{0.71}Ga_{0.29}As_{0.63}P_{0.37}$ can be used. An InP cap layer 615 is fabricated over the active layer 610, and a p⁺-type diffused layer 620 is formed through the cap, partially extending (in this example, 0.25 microns) into the active layer 610.

Figure 7:
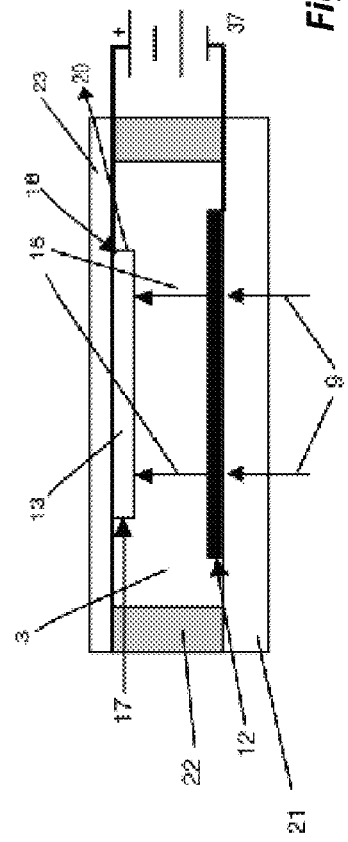
FIG. 7 a schematic diagram showing an image sensor according to one embodiment of the invention.

An exemplary electron bombarded active pixel sensor component is shown in FIG. 7. In FIG. 7, the active pixel sensor component includes a vacuum enclosure 3 that houses a photocathode 12 in proximity focus with a specialized active pixel array sensor chip 13. The sensor chip 13 forms the anode for receiving proximity focused photoelectrons from the photocathode 12. The active pixel array sensor 13 is mounted with its backside facing the photocathode 12. In one embodiment, the backside of the substrate of the active pixel array sensor 13 is thinned. Thinning the backside of the substrate provides for a greater collection efficiency of the photoelectron excited carriers and reduces the crosstalk between pixels as a result of diffusion. The active pixel sensor array 13 may also include a passivated surface or layer.

The base of the vacuum device 3 is a transparent faceplate 21. The photocathode 12 is positioned on the faceplate 21. Vacuum enclosure sidewalls 22 extend between the transparent faceplate 21 and the header assembly 23. The active pixel sensor chip 13 is positioned on the header assembly 23. The header assembly 23 also allows for electrical feedthroughs for applying and reading back control voltages 17, bias voltage 18, and signal output lines 20 associated with the active pixel array sensor chip 13. Control electronics (not shown) are used to read out and operate the pixel array.

The photocathode 12 is an InP/InGaAsP transferred electron photocathode. A photocathode bias voltage is applied between the grid line (FIG. 5) and the InP substrate to bias the photocathode and enable photoemission. See, for example, U.S. Pat. No. 5,047,821, the entirety of which is hereby incorporated by reference. An electron accelerating voltage 37 is applied to the photocathode 12 relative to the active pixel sensor chip 13. Photoelectrons 15 are emitted from the photocathode 12 in response to incident light in the form of an optical image 9. Optical components (not shown) are typically employed to form the optical image on the photocathode 12. A projection system may be used to place the image on the photocathode 12.

An anode voltage 18 is applied to the sensor 13. The photoelectrons 15 are accelerated by virtue of the difference between the accelerating voltage 37 and the anode voltage 18. In one embodiment, the accelerating voltage 37 is negative with respect to the anode voltage 18. This permits biasing the sensor 13 to near (or at) ground potential to simplify interfacing with other components. Control signals and bias voltages 17 are applied to the active pixel sensor 3 and a video output signal 20 may be taken off the sensor 13.

The electron bombarded active pixel array sensor 13 is usefully employed in various systems, such as cameras, night vision imagers and the like. To that end, optical lenses or the like form an image of real objects on a focal plane which is disposed to coincide with the photocathode 12. Taken together, the electron bombarded active pixel array component with optics, power supply and control electronics may be regarded as a camera system.

It should be understood that processes and techniques described herein are not inherently related to any particular apparatus and may be implemented by any suitable combination of components. Further, various types of general purpose devices may be used in accordance with the teachings described herein. The present invention has been described in relation to particular examples, which are intended in all respects to be illustrative rather than restrictive. Those skilled in the art will appreciate that many different combinations will be suitable for practicing the present invention.

Moreover, other implementations of the invention will be apparent to those skilled in the art from consideration of the specification and practice of the invention disclosed herein. Various aspects and/or components of the described embodiments may be used singly or in any combination. It is intended that the specification and examples be considered as exemplary only, with a true scope and spirit of the invention being indicated by the following claims.

What is claimed is:

1. A night vision apparatus, comprising:
   a sensor comprising a semiconductor absorption layer of composition that limits long wavelength response cutoff to between 1.25 to 1.4 μm wavelength;
   an imaging chip positioned behind and connected to the sensor;
   electronics collecting signals from the imaging chip;
   wherein the camera senses light at low lighting conditions at wavelengths restricted to be below 1.4 μm with low dark current at ambient operating temperatures.

2. The night vision apparatus of claim 1, wherein the absorption layer comprises InGaAsP having a composition that limits long wavelength response cutoff to between 1.25 to 1.4 μm wavelength.

3. The night vision apparatus of claim 2, wherein the absorption layer comprises $In_{1-x}Ga_xAs_yP_{1-y}$ composition in the range of $In_{0.68}Ga_{0.32}As_{0.69}P_{0.31}$ to $In_{0.76}Ga_{0.24}As_{0.51}P_{0.49}$.

4. The night vision apparatus of claim 2, wherein the absorption layer comprises $In_{0.71}Ga_{0.29}As_{0.63}P_{0.37}$.

5. The night vision apparatus of claim 2, wherein the absorption layer comprises a semiconductor having a bandgap in the 1.35-1.40 microns wavelength.

6. The night vision apparatus of claim 1, wherein the imaging chip comprises a CMOS anode array having 1600×1200 pixels.

7. The night vision apparatus of claim 6, wherein the imaging chip comprises a 10.8 micron pixel pitch.

8. The night vision apparatus of claim 7, wherein the imaging chip operates at 60 Hz.

9. The night vision apparatus of claim 1, wherein the absorption layer comprises $(Al_sGa_{1-s})_{1-t}In_tAs$ semiconductor alloy system wherein s, and t vary between 0 and 1.

10. A sensor for night vision applications, comprising:
    an InP substrate;
    an InP buffer layer fabricated on one surface of the InP substrate;

an InGaAsP absorption layer fabricated on the InP buffer layer;

an InP cap layer formed over the absorption layer; and, wherein the InGaAsP absorption layer limits long wavelength response cutoff to between 1.25 to 1.4 μm wavelength.

11. The sensor of claim 10, further comprising a grading layer fabricated between the InGaAsP absorption layer and the InP cap layer, and wherein the InP cap layer forms an emitter layer.

12. The sensor of claim 11, further comprising:

a schottky barrier layer formed over the InP cap layer; and, contact grid formed over the InP cap layer.

13. The sensor of claim 12, wherein the InGaAsP absorption layer comprises $In_{1-x}Ga_xAs_yP_{1-y}$ composition in the range of $In_{0.68}Ga_{0.32}As_{0.69}P_{0.31}$ to $In_{0.76}Ga_{0.24}As_{0.51}P_{0.49}$.

14. The sensor of claim 10, further comprising a p-type diffusion layer formed through the InP cap layer and partially extending into the InGaAsP absorption layer.

15. The sensor of claim 14, wherein the InGaAsP absorption layer comprises $In_{1-x}Ga_xAs_yP_{1-y}$ composition in the range of $In_{0.68}Ga_{0.32}As_{0.69}P_{0.31}$ to $In_{0.76}Ga_{0.24}As_{0.51}P_{0.49}$.

16. The sensor of claim 10, wherein the InGaAsP absorption layer comprises $In_{1-x}Ga_xAs_yP_{1-y}$ composition in the range of $In_{0.68}Ga_{0.32}As_{0.69}P_{0.31}$ to $In_{0.76}Ga_{0.24}As_{0.51}P_{0.49}$.

17. A night vision apparatus, comprising:

a sensor that limits long wavelength response cutoff to between 1.25 to 1.4 μm wavelength;

an imaging chip positioned behind and connected to the sensor and comprising an array having 1600×1200 pixels at a 10.8 micron pixel pitch and operating at 60 Hz.

18. The night vision apparatus of claim 17, wherein the sensor comprises an InP substrate and an InGaAsP absorption layer fabricated over the InP substrate.

19. The night vision apparatus of claim 18, wherein the InGaAsP absorption layer comprises $In_{1-x}Ga_xAs_yP_{1-y}$ composition in the range of $In_{0.68}Ga_{0.32}As_{0.69}P_{0.31}$ to $In_{0.76}Ga_{0.24}As_{0.51}P_{0.49}$.

20. The night vision apparatus of claim 17, wherein the sensor comprises an absorption layer consisting $(Al_sGa_{1-s})_{1-t}In_tAs$ semiconductor alloy system wherein s, and t vary between 0 and 1.

* * * * *